United States Patent
Ko et al.

(10) Patent No.: US 9,136,396 B2
(45) Date of Patent: Sep. 15, 2015

(54) SEMICONDUCTOR DEVICE AND METHOD OF MANUFACTURING THE SAME

(71) Applicant: Electronics and Telecommunications Research Institute, Daejeon (KR)

(72) Inventors: Sang Choon Ko, Daejeon (KR); Jae Kyoung Mun, Daejeon (KR); Byoung-Gue Min, Daejeon (KR); Young Rak Park, Daejeon (KR); Hokyun Ahn, Daejeon (KR); Jeong-Jin Kim, Jeollabuk-do (KR); Eun Soo Nam, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 13/905,213

(22) Filed: May 30, 2013

(65) Prior Publication Data

US 2014/0159049 A1    Jun. 12, 2014

(30) Foreign Application Priority Data

Dec. 12, 2012    (KR) .......................... 10-2012-0144273

(51) Int. Cl.
*H01L 29/66*    (2006.01)
*H01L 29/808*    (2006.01)
(Continued)

(52) U.S. Cl.
CPC .......... *H01L 29/808* (2013.01); *H01L 29/4175* (2013.01); *H01L 29/66462* (2013.01); *H01L 29/7786* (2013.01); *H01L 29/2003* (2013.01);

(Continued)

(58) Field of Classification Search
CPC . H01L 21/486; H01L 29/808; H01L 29/4175; H01L 29/7786; H01L 29/66462; H01L 29/66; H01L 29/66924
See application file for complete search history.

(56) References Cited

U.S. PATENT DOCUMENTS 6,531,328 B1 *  3/2003  Chen ............................. 438/26
7,233,028 B2     6/2007  Weeks
(Continued)

FOREIGN PATENT DOCUMENTS

JP    2008-258281 A    10/2008
JP    2012-038885 A     2/2012

OTHER PUBLICATIONS

Azadeh Ansari et al., "Gallium Nitride-on-Silicon Micromechanical Overtone Resonators and Filters", Electron Devices Meeting (IEDM), 2011 IEEE International, Dec. 5-7, 2011, pp. 20.3.1-20.3.4.

(Continued)

*Primary Examiner* — Minh-Loan Tran
*Assistant Examiner* — Fazli Erdem
(74) *Attorney, Agent, or Firm* — Rabin & Berdo, P.C.

(57) ABSTRACT

A method of manufacturing a semiconductor device includes forming devices including source, drain and gate electrodes on a front surface of a substrate including a bulk silicon, a buried oxide layer, an active silicon, a gallium nitride layer, and an aluminum-gallium nitride layer sequentially stacked, etching a back surface of the substrate to form a via-hole penetrating the substrate and exposing a bottom surface of the source electrode, conformally forming a ground interconnection on the back surface of the substrate having the via-hole, forming a protecting layer on the front surface of the substrate, and cutting the substrate to separate the devices from each other.

14 Claims, 11 Drawing Sheets

(51) Int. Cl.
  *H01L 29/417* (2006.01)
  *H01L 29/778* (2006.01)
  *H01L 29/43* (2006.01)
  *H01L 29/45* (2006.01)
  *H01L 29/20* (2006.01)

(52) U.S. Cl.
  CPC ......... *H01L 29/41758* (2013.01); *H01L 29/432* (2013.01); *H01L 29/454* (2013.01)

(56) References Cited

U.S. PATENT DOCUMENTS

| | | | |
|---|---|---|---|
| 8,350,288 B2 | 1/2013 | Therrien et al. | |
| 2002/0117681 A1* | 8/2002 | Weeks et al. | 257/106 |
| 2004/0130002 A1* | 7/2004 | Weeks et al. | 257/622 |
| 2007/0284602 A1* | 12/2007 | Chitnis et al. | 257/98 |
| 2007/0295985 A1* | 12/2007 | Weeks et al. | 257/103 |
| 2008/0073752 A1* | 3/2008 | Asai et al. | 257/615 |
| 2008/0149964 A1* | 6/2008 | Sugimoto et al. | 257/192 |
| 2008/0206989 A1* | 8/2008 | Kruger et al. | 438/667 |
| 2008/0286963 A1* | 11/2008 | Krueger et al. | 438/637 |
| 2009/0001478 A1* | 1/2009 | Okamoto | 257/382 |
| 2009/0194773 A1* | 8/2009 | Hanson et al. | 257/77 |
| 2010/0059791 A1 | 3/2010 | Takagi | |
| 2010/0295100 A1* | 11/2010 | Huang et al. | 257/256 |
| 2011/0241074 A1* | 10/2011 | Okamoto | 257/194 |
| 2012/0007101 A1* | 1/2012 | Yang et al. | 257/76 |
| 2012/0021582 A1* | 1/2012 | Nishi | 438/299 |
| 2012/0153476 A1* | 6/2012 | Shen | 257/750 |
| 2012/0175777 A1* | 7/2012 | Hill et al. | 257/753 |
| 2012/0228650 A1* | 9/2012 | Chern et al. | 257/88 |
| 2012/0320550 A1* | 12/2012 | Bar et al. | 361/760 |
| 2012/0329213 A1* | 12/2012 | Vinciguerra et al. | 438/113 |
| 2013/0026631 A1* | 1/2013 | Min | 257/750 |
| 2013/0277845 A1* | 10/2013 | Chen et al. | 257/762 |

OTHER PUBLICATIONS

Masahiro Hikita et al., "AlGaN/GaN Power HFET on Silicon Substrate With Source-Via Grounding (SVG) Structure", IEEE Transactions on Electron Devices, Sep. 2005, pp. 1963-1968, vol. 52, No. 9.

* cited by examiner

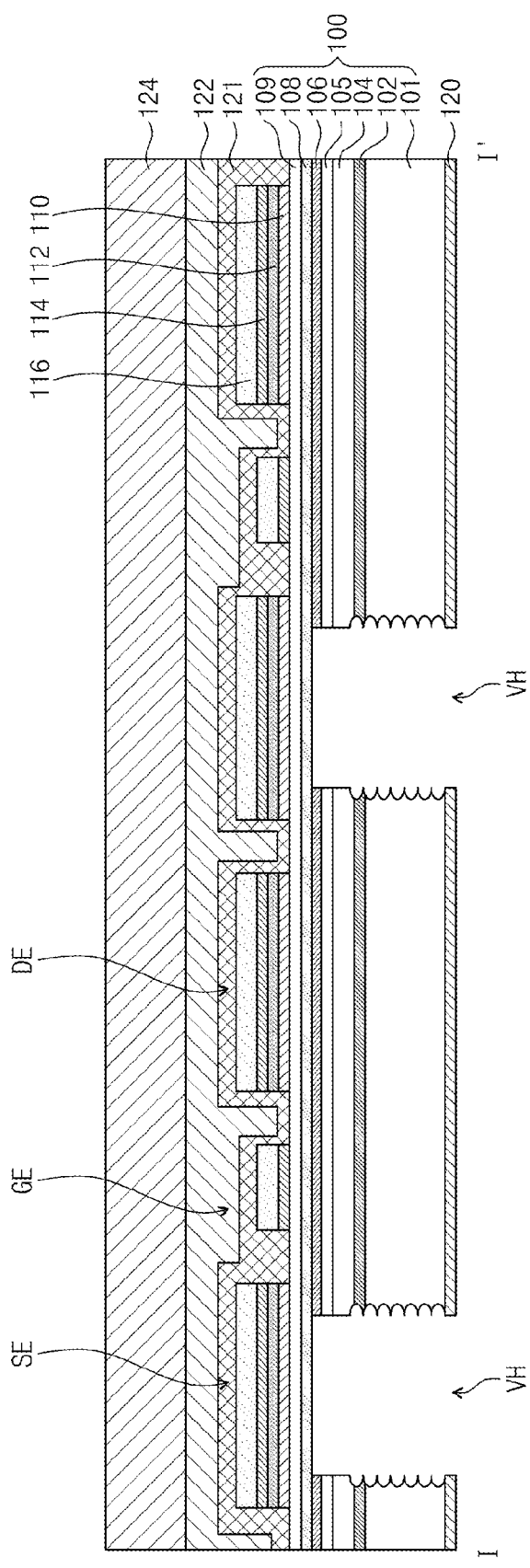

SEMICONDUCTOR DEVICE AND METHOD OF MANUFACTURING THE SAME

CROSS-REFERENCE TO RELATED APPLICATIONS

This U.S. non-provisional patent application claims priority under 35 U.S.C. §119 to Korean Patent Application No. 10-2012-0144273, filed on Dec. 12, 2012, the entirety of which is incorporated by reference herein.

BACKGROUND

The inventive concept relates to semiconductor devices and methods of manufacturing the same, more particularly, to semiconductor devices having via-holes and methods of manufacturing the same.

A wafer of a gallium nitride-on-silicon (111) structure may use a bulk silicon substrate as a handle wafer. When compound semiconductor devices and micro-electromechanical system (MEMS) devices having membrane structures are manufactured using the wafer of the gallium nitride-on-silicon (111) structure, polishing techniques such as a chemical mechanical polishing (CMP) technique and a lapping technique are presently used in order that a thickness of a membrane exactly meets a designed numerical value. However, the polishing techniques may require many trials and errors for exactly controlling a thickness of several tens micrometers, such that various problems may occur during processes using the polishing techniques described above.

Meanwhile, through-silicon-via (TSV) techniques have been suggested for manufacturing devices having excellent electrical and thermal characteristics. However, when a TSV is manufactured using a thinned handle wafer, a warpage phenomenon of a wafer may occur. Thus, a remaining stress of the wafer should be controlled and/or a dummy stress buffer layer should be added on the wafer during the process.

SUMMARY

Embodiments of the inventive concept may provide semiconductor devices having excellent electrical and thermal characteristics.

Embodiments of the inventive concept may also provide methods of manufacturing a semiconductor device having excellent electrical and thermal characteristics.

In one aspect, a method of manufacturing a semiconductor device may include: forming devices on a front surface of a substrate, each of the devices including a source electrode, a drain electrode, and a gate electrode, and the substrate including a bulk silicon, a buried oxide layer, an active silicon, a gallium nitride layer, and an aluminum-gallium nitride layer which are sequentially stacked; forming a via-hole penetrating the substrate by etching a back surface of the substrate, the via-hole exposing a bottom surface of the source electrode; conformally forming a ground interconnection on the back surface of the substrate having the via-hole; forming a protecting layer on the front surface of the substrate on which the devices are formed; and cutting the substrate between the devices to separate the devices from each other.

In an embodiment, forming the via-hole may include: forming a mask on the back surface of the substrate; etching the bulk silicon using the mask as an etch mask by a reactive ion etching (RIE) process until the buried oxide layer is exposed; etching the exposed buried oxide layer and the active silicon by a radio frequency (RF) plasma process until the gallium nitride layer is exposed; and etching the exposed gallium nitride layer and the aluminum-gallium nitride layer by an induced coupled plasma reactive ion etching (ICP RIE) process.

In an embodiment, before forming the via-hole, the method may further include: forming an insulating layer on the front surface of the substrate on which the devices are formed; and bonding a handle wafer to a top surface of the insulating layer.

In an embodiment, the insulating layer may include poly methyl methacrylate (PMMA); and the handle wafer may be bonded to the insulating layer by a wax.

In an embodiment, the method may further include: forming a seed layer on the back surface of the substrate having the via-hole. The ground interconnection may be formed using the seed layer.

In an embodiment, the seed layer may include titanium/copper (Ti/Cu); and the ground interconnection may be formed by a copper plating process.

In an embodiment, the protecting layer may include a photoresist.

In an embodiment, water may be sprayed during the cutting process of the substrate.

In an embodiment, the method may further include: forming a nucleation layer on the active silicon. The gallium nitride layer may be formed by an epitaxial growth process using the nucleation layer as a seed.

In an embodiment, the nucleation layer may include aluminum nitride (AlN).

In an embodiment, the method may further include: forming a capping layer on the aluminum-gallium nitride layer.

In an embodiment, the capping layer may include gallium nitride (GaN).

In another aspect, a semiconductor device may include: a substrate including a bulk silicon, a buried oxide layer, an active silicon, a gallium nitride layer, and an aluminum-gallium nitride layer; a source electrode, a drain electrode, and a gate electrode disposed on a front surface of the substrate; and a ground interconnection disposed along a back surface of the substrate and an inner sidewall of a via-hole penetrating the substrate, the ground interconnection electrically connected to the source electrode.

In an embodiment, the substrate may further include: a nucleation layer between the active silicon and the gallium nitride layer, the nucleation layer including aluminum nitride; and a capping layer on the aluminum-gallium nitride layer, the capping layer including gallium nitride.

In an embodiment, each of the source and drain electrodes may have a stack structure having sequentially stacked titanium, aluminum, nickel, and gold.

In an embodiment, the gate electrode may have a stack structure having sequentially stacked nickel and gold.

In an embodiment, the semiconductor device may further include: a seed layer between the ground interconnection and the back surface of the substrate; and an oxidation preventing layer on the ground interconnection.

In an embodiment, the seed layer may include titanium/copper; the ground interconnection may include copper; and the oxidation preventing layer may include titanium/gold.

BRIEF DESCRIPTION OF THE DRAWINGS

The inventive concept will become more apparent in view of the attached drawings and accompanying detailed description.

FIGS. 2A through 2I are cross-sectional views illustrating a method of manufacturing a semiconductor device according to exemplary embodiments of the inventive concept;

DETAILED DESCRIPTION OF THE EMBODIMENTS

Figure 1A:
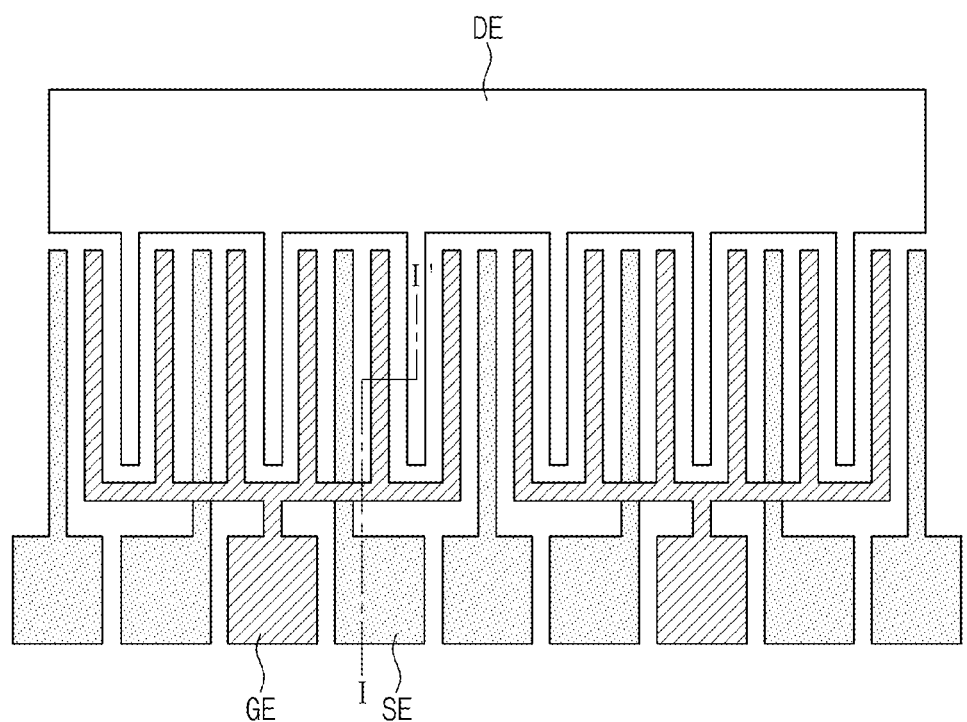
FIG. 1A is a plan view illustrating a semiconductor device according to exemplary embodiments of the inventive concept.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Figure 1B:
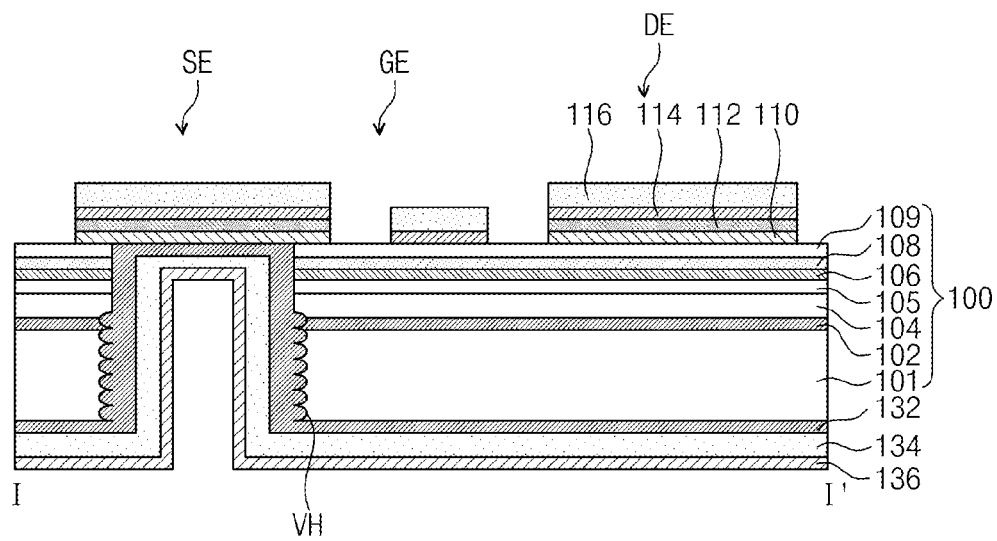
FIG. 1B is a cross-sectional view taken along a line I-I' of FIG. 1A.

FIG. 1A is a plan view illustrating a semiconductor device according to exemplary embodiments of the inventive concept. FIG. 1B is a cross-sectional view taken along a line I-I' of FIG. 1A.

Referring to FIGS. 1A and 1B, a semiconductor device may include a source electrode SE, a gate electrode GE, a drain electrode DE, and a ground interconnection which are formed on a substrate 100.

The substrate 100 may include a silicon-on-insulator (SOI), a gallium nitride (GaN) layer 106, and an aluminum-gallium nitride (AlGaN) layer 108 which are sequentially stacked. In an embodiment, the SOI may include a bulk silicon 101, an buried oxide layer 102, and an active silicon 104. In this case, the bulk silicon 101 and the active silicon 104 may have a [111] crystal direction. The SOI may be formed by one of various methods. In an embodiment, a first wafer having the buried oxide layer 102 may be bonded to a second wafer having the active silicon 104 and then the rest portion of the second wafer except the active silicon 104 may be removed from the bonded structure, thereby forming the SOI. In another embodiment, the SOI may be formed by a separation by implanted oxygen (SIMOX) method. That is, oxygen ions may be implanted into a wafer to form the buried oxide layer 102. A portion of the wafer disposed on the buried oxide layer 102 may correspond to the active silicon 104, and another portion of the wafer disposed under the buried oxide layer 102 may correspond to the bulk silicon 101.

In an embodiment, a nucleation layer 105 may be disposed between the SOI (101, 102, and 104) and the gallium nitride layer 106. The nucleation layer 105 may include aluminum nitride (AlN).

In an embodiment, a capping layer 109 may be additionally disposed on the aluminum-gallium nitride layer 108. The capping layer 109 may include gallium nitride (GaN).

In an embodiment, it may be preferable that a thickness of the active silicon 104 of the SOI is controlled to exactly meet a designed numerical value. Thus, it is possible to reduce or minimize mechanical and electrical characteristic variation caused by a thickness difference of the active silicon 104.

The multi-layered substrate 100 described above may be applied to a radio frequency (RF) power amplifier, a compound power semiconductor, a Schottky barrier diode (SBD), a micro-electromechanical system (MEMS) resonator, and/or a filter. Additionally, the multi-layered substrate 100 may be applied to devices operated in high temperature environment and/or fields requiring compound devices for energy saving.

The source electrode SE, the gate electrode GE, and the drain electrode DE may be disposed on a first surface of the substrate. The source electrode SE, the gate electrode GE, and the drain electrode DE may be disposed to be spaced apart from each other.

In an embodiment, a top surface of the source electrode SE may be disposed at substantially the same level as a top surface of the drain electrode DE. A top surface of the gate electrode GE may be lower than the top surface of the source or drain electrode SE or DE.

The source electrode SE may include a conductive material and may have a multi-layered structure. For example, the source electrode SE may have a titanium (Ti) layer 110, an aluminum (Al) layer 112, a nickel (Ni) layer 114, and a gold (Au) layer 116 which are sequentially stacked.

The drain electrode DE may include a conductive material and may have a multi-layered structure. For example, the drain electrode DE may have a titanium layer 110, an aluminum layer 112, a nickel layer 114, and a gold layer 116 which are sequentially stacked.

The gate electrode GE may be disposed between the source electrode SE and the drain electrode DE. The gate electrode GE may include a conductive material and may have a multi-layered structure. For example, the gate electrode GE may include a nickel layer 114 and a gold layer 116 that are sequentially stacked.

The ground interconnection 134 may be disposed on a second surface of the substrate 100. The ground interconnection 134 is electrically connected to the source electrode SE.

According to an embodiment of the inventive concept, a via-hole VH exposing a bottom surface of the source electrode SE may be formed at the second surface of the substrate 100. The via-hole VH may penetrate the substrate 100. A sidewall of the via-hole VH may have an uneven structure. The ground interconnection 134 may conformally extend along an inner surface of the via-hole VH and may be electrically connected to the source electrode SE.

The ground interconnection 134 may not completely fill the via-hole VH. That is, the ground interconnection 134 may be conformally formed in the via-hole VH. The ground interconnection 134 may include copper (Cu). In an embodiment, a seed layer 132 may be disposed between the ground interconnection 134 and the substrate 100 having the via-hole VH. The seed layer 132 may include titanium/copper (Ti/Cu). In another embodiment, an oxidation preventing layer 136 may be disposed on the ground interconnection 134. The oxidation preventing layer 136 may prevent the ground interconnection 134 from being oxidized. The oxidation preventing layer 136 may include titanium/gold (Ti/Au).

As described above, since the substrate 100 has the multi-layered structure formed of materials different from each other, a stress applied to the substrate may be reduced during the formation of the via-hole VH. Additionally, since the substrate 100 includes the SOI (101, 102, and 104), a leakage current characteristic of the semiconductor device may be improved as compared with a device including only bulk silicon.

Moreover, since the ground interconnection 134 is formed on a back surface (e.g., the second surface) of the substrate 100 through the via-hole VH, the semiconductor device may be stably grounded and a heat radiating effect of the semiconductor device may be improved. For example, devices using frequencies equal to or greater than a Ku-band and switching devices may generate heat by switching operation. However, according to embodiments of the inventive concept, the ground interconnection 134 may be formed through the via-hole VH of the back surface, such that the heat radiating effect of the semiconductor device may be greatly improved.

Figure 1C:
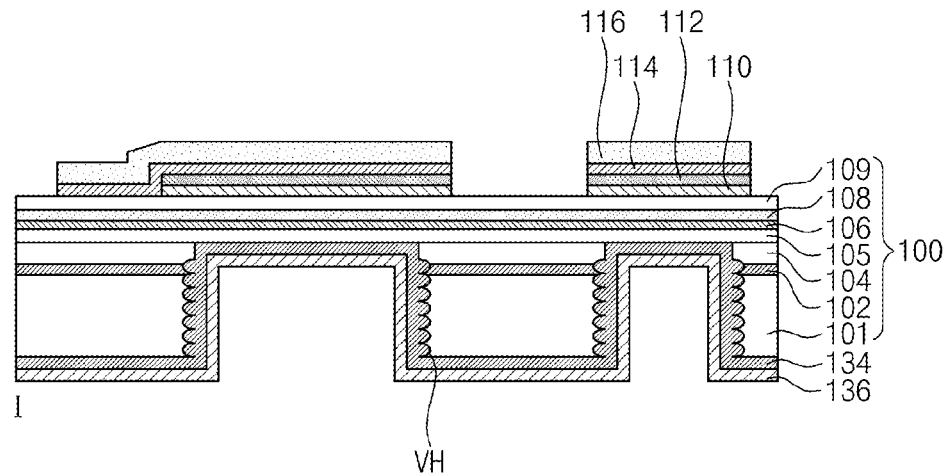
FIG. 1C is a cross-sectional view illustrating a modified example of a semiconductor device according to exemplary embodiments of the inventive concept.

FIG. 1C is a cross-sectional view illustrating a modified example of a semiconductor device according to exemplary embodiments of the inventive concept.

Referring to FIG. 1C, patterns may be formed on the first surface of the substrate 100 in the present modified example. The patterns may include a conductive material. The via-hole VH may be formed at the second surface of the substrate 100. The via-hole VH may penetrate the SOI (101, 102, and 104) of the substrate 100. In other words, the gallium nitride layer 106 may be exposed by the via-hole VH. The semiconductor device illustrated in FIG. 1C may be applied to a MEMS resonator device having a source via grounding structure.

FIGS. 2A through 2I are cross-sectional views illustrating a method of manufacturing a semiconductor device according to exemplary embodiments of the inventive concept.

Figure 2A:
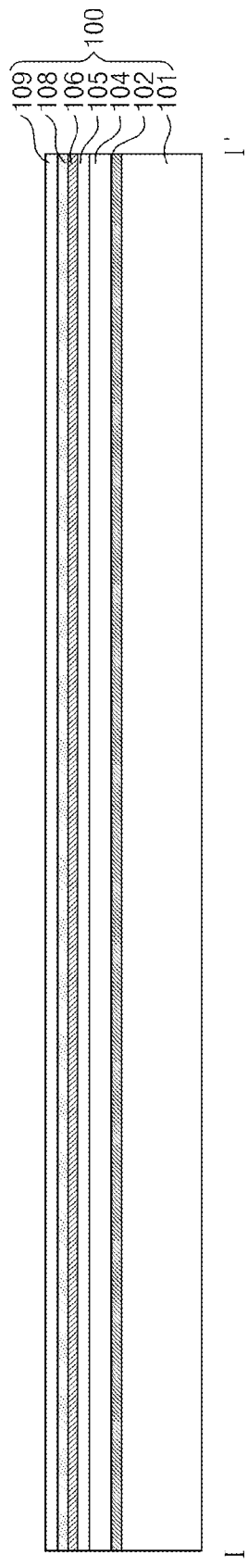

Referring to FIG. 2A, a substrate 100 may be formed.

In more detail, a SOI (101, 102, and 104) may be prepared. The SOI (101, 102, and 104) may include a bulk silicon 101, a buried oxide layer 102, and an active silicon 104. The bulk silicon 101 and the active silicon 104 of the SOI may be formed to have a [111] crystal direction.

A nucleation layer 105 may formed on the SOI (101, 102, and 104). The nucleation layer 105 may include aluminum nitride (AlN). A gallium nitride (GaN) layer 106 and an aluminum-gallium nitride (AlGaN) layer 108 may be sequentially formed on the nucleation layer 105 by an epitaxial growth process using the nucleation layer 105 as a seed.

Thus, the substrate 100 may be formed to include the SOI (101, 102, and 104), the nucleation layer 105, the gallium nitride layer 106, and the aluminum-gallium nitride layer 108 which are sequentially stacked.

In an embodiment, a capping layer 109 may be further formed on the aluminum-gallium nitride layer 108. The capping layer 109 may include gallium nitride (GaN).

Figure 2B:
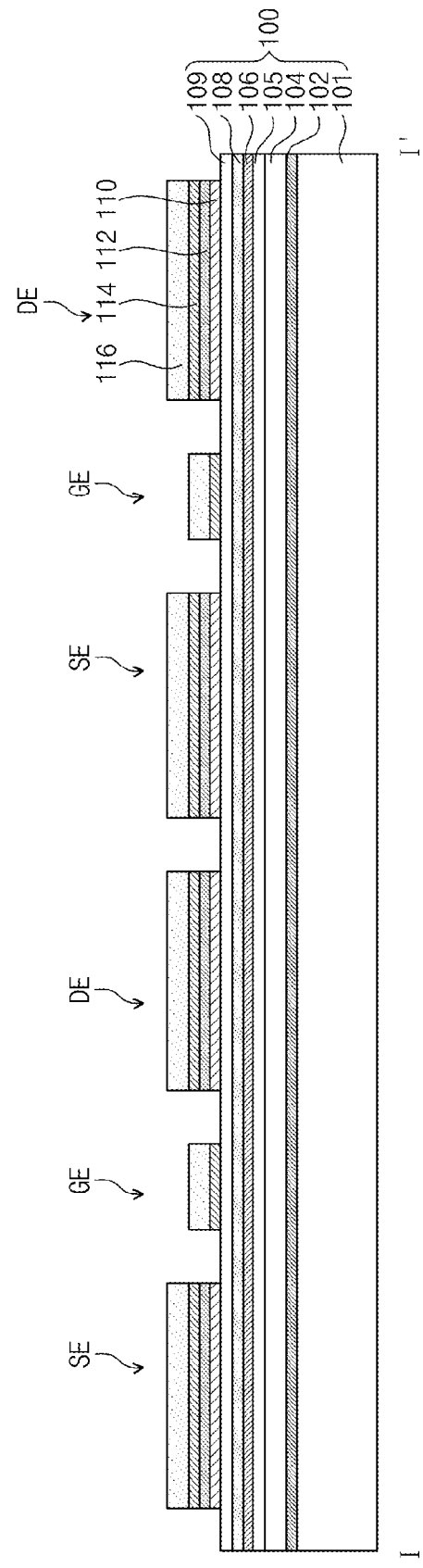

Referring to FIG. 2B, a plurality of semiconductor devices may be formed on the substrate 100. Each of the semiconductor devices may include a source electrode SE, a gate electrode GE, and a drain electrode DE.

In an embodiment, even though not shown in the drawings, dopant regions may be formed by an ion implantation process. Next, a titanium (Ti) layer 110, an aluminum (Al) layer 112, a nickel (Ni) layer 114, and a gold (Au) layer 116 may be sequentially formed and then may be thermally treated at a temperature of about 850 degrees Celsius under a nitrogen atmosphere by a rapid thermal annealing (RTA) process. An ohmic contact may be formed by the RTA process. Thereafter, the layers 110, 112, 114, and 116 may be patterned to form the source electrode SE and the drain electrode DE.

After a nickel layer 114 and a gold layer 116 are sequentially stacked, the layers 114 and 116 may be thermally treated at a temperature of about 350 degrees Celsius under a nitrogen atmosphere and then may be patterned to form the gate electrode GE.

Figure 2C:
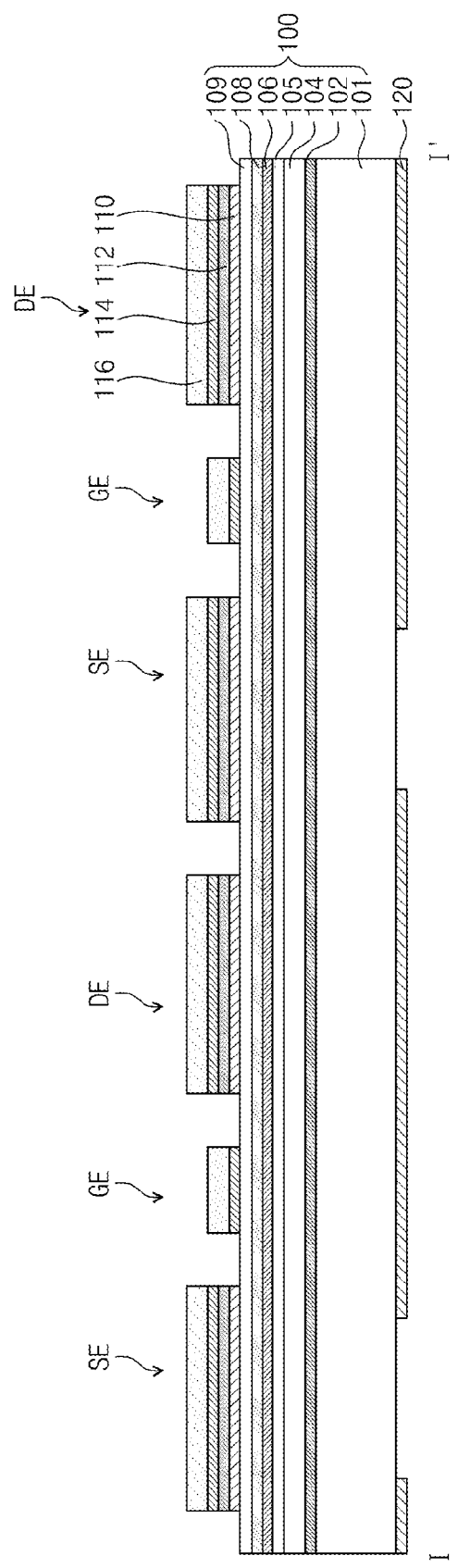

Referring to FIG. 2C, a mask 120 may be formed on a back surface of the substrate 100.

The mask 120 may include a material having an etch selectivity with respect to the bulk silicon 101 of the SOI of the substrate 100 during an etching process using an etchant. For example, the mask 120 may include aluminum (Al). The mask 120 may expose the back surface of the substrate 100 which corresponds to the source electrode SE.

Figure 2D:
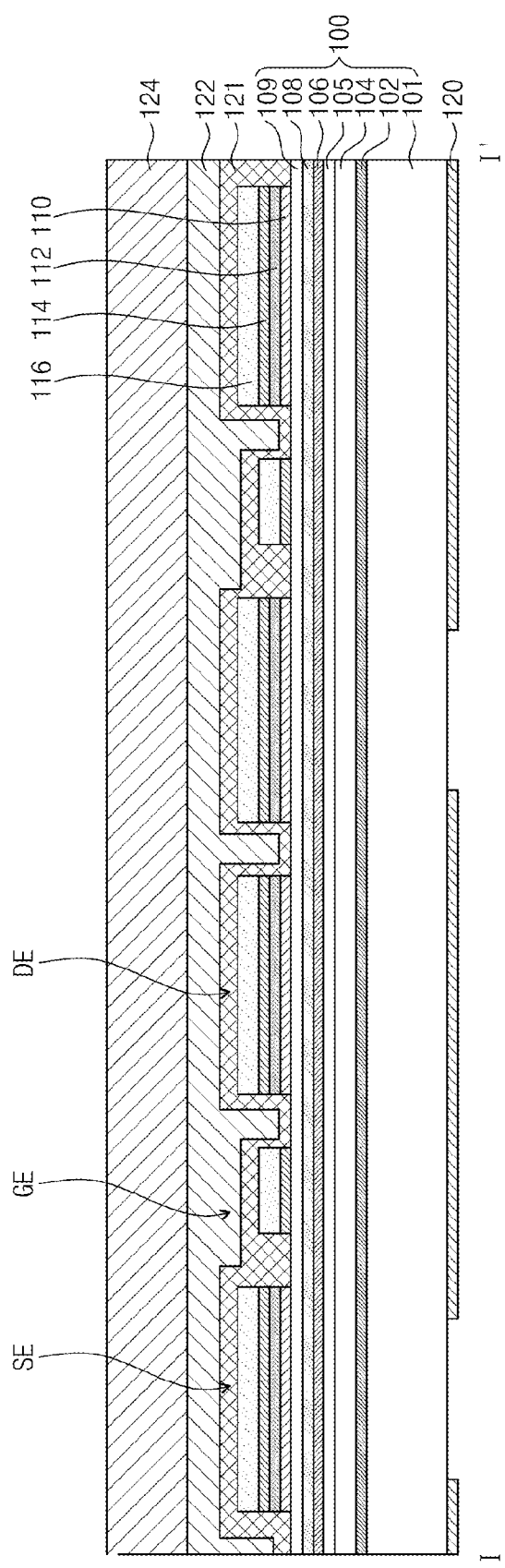

Referring to FIG. 2D, an insulating layer 121 and a handle wafer 124 may be formed to cover a front surface of the substrate 100 on which the semiconductor devices are formed.

In an embodiment, the insulating layer 121 may include poly methyl methacrylate (PMMA). After the PMMA is coated at about 2000 rpm, a thermal treatment may be repeatedly performed three or four times at a temperature of about 180 degrees Celsius, thereby forming the insulating layer 121.

Subsequently, the handle wafer 124 may be bonded using a wax 122 to the insulating layer 121. The handle wafer 124 may be a sapphire handle wafer.

Figure 2E:
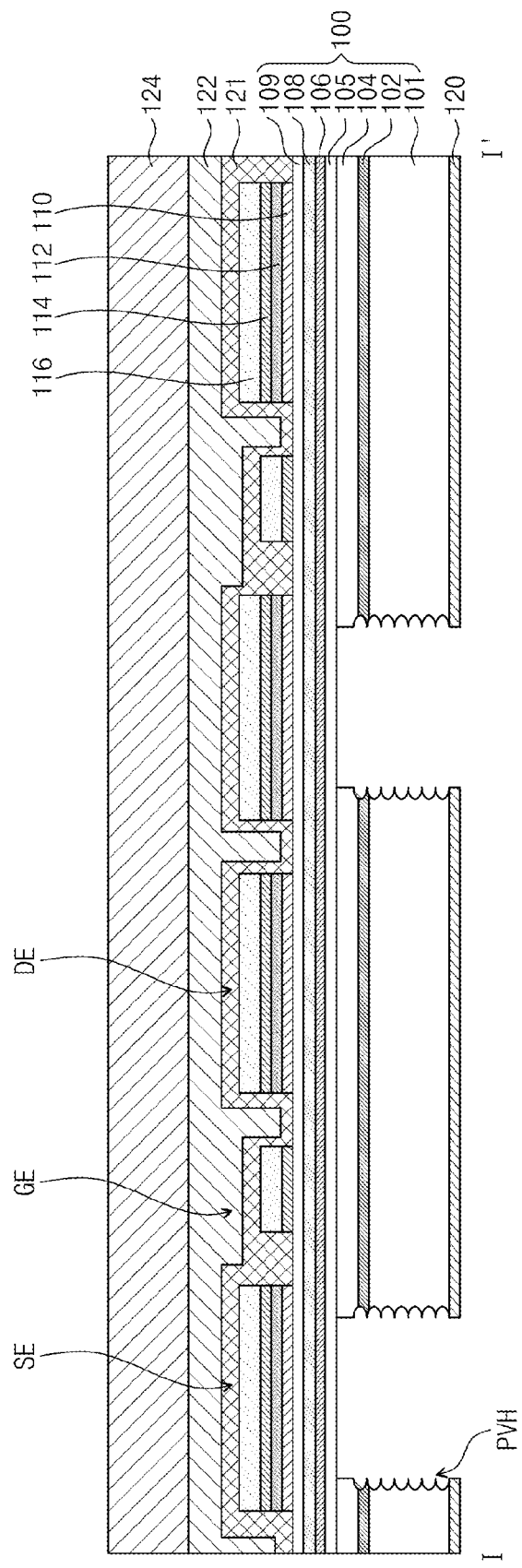

Referring to FIG. 2E, the bulk silicon 101 of the SOI may be etched using the mask 120 on the back surface of the substrate 100 as an etch mask until the buried oxide layer 102 of the SOI is exposed. Subsequently, the buried oxide layer 120 and the active silicon 104 of the SOI may be sequentially etched to form a preliminary via-hole PVH.

In an embodiment, the bulk silicon 101 of the SOI may be etched by a reactive ion etching (RIE) process. In another embodiment, the bulk silicon 101 of the SOI may be etched by a radio frequency (RF) plasma process using a high RF power. At this time, the buried oxide layer 102 of the SOI may function as an etch stop layer.

Next, the exposed buried oxide layer 102 may be etched by a dry etching process and then the exposed active silicon 104 of the SOI may be etched by the dry etching process. In an embodiment, the dry etching process may be a RF plasma process using a low RF power.

As described above, the bulk silicon 101 of the SOI is etched by the RIE process or the high RF plasma process and then the buried oxide layer 102 and the active silicon 104 may be etched by the low RF plasma process. Thus, an etch stress of the substrate 100 may be reduced or minimized Additionally, since different material layers are respectively etched using different powers for the formation of the preliminary via-hole PVH, it is possible to prevent the substrate 100 from becoming concave or convex by a remaining stress of a via-hole VH formed in a subsequent process or by a compressive stress and a tensile stress of the multi-layer.

Referring to FIG. 2F, the nucleation layer 105 exposed by the preliminary via-hole PVH, the gallium nitride layer 106, and the aluminum-gallium nitride layer 108 may be etched to form a via-hole VH.

In an embodiment, the nucleation layer 105, the gallium nitride layer 106, and the aluminum-gallium nitride layer 108 may be etched by an induced coupled plasma reactive ion etching (ICP RIE) process.

If the capping layer 109 is disposed on the aluminum-gallium nitride layer 108 according to another embodiment, the capping layer 109 may also be etched by the ICP RIE process.

Thus, the via-hole VH may completely penetrate the substrate 100. Additionally, the via-hole VH may expose at least a portion of a bottom surface of the source electrode SE.

Figure 2G:
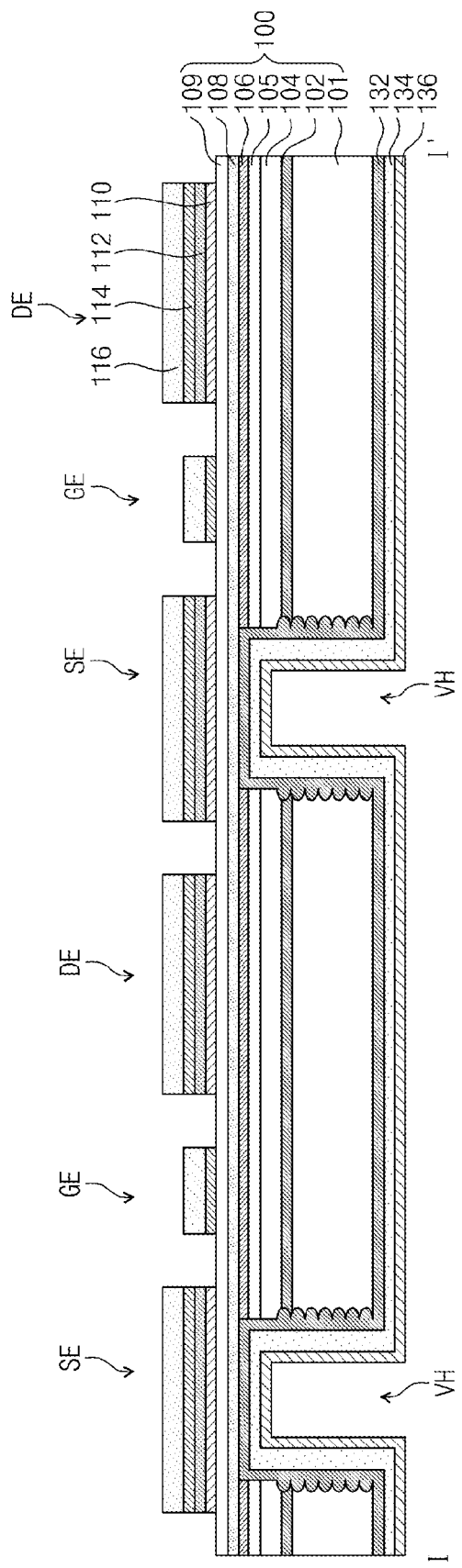

Referring to FIG. 2G, a ground interconnection 134 may be conformally formed on the back surface of the substrate 100 having the via-hole VH.

In an embodiment, in the first place, a seed layer 132 may be conformally formed on the back surface of the substrate 100 having the via-hole VH. The seed layer 132 may include titanium/copper (Ti/Cu).

Subsequently, the ground interconnection 134 may formed by an electroplating process using the seed layer 132. The ground interconnection 134 may include copper (Cu). The ground interconnection 134 may have a thickness of about 10 μm.

In an embodiment, an oxidation preventing layer 136 may be formed on the ground interconnection 134 for preventing the ground interconnection 134 from being oxidized. The oxidation preventing layer 136 may include titanium/gold (Ti/Au).

Next, the handle wafer 124 and the insulating layer 121 may be removed. After the handle wafer 124 is removed, a cleaning process using trichloroethene (TCE) and acetone may be performed to remove the insulating layer 121.

Figure 2H:
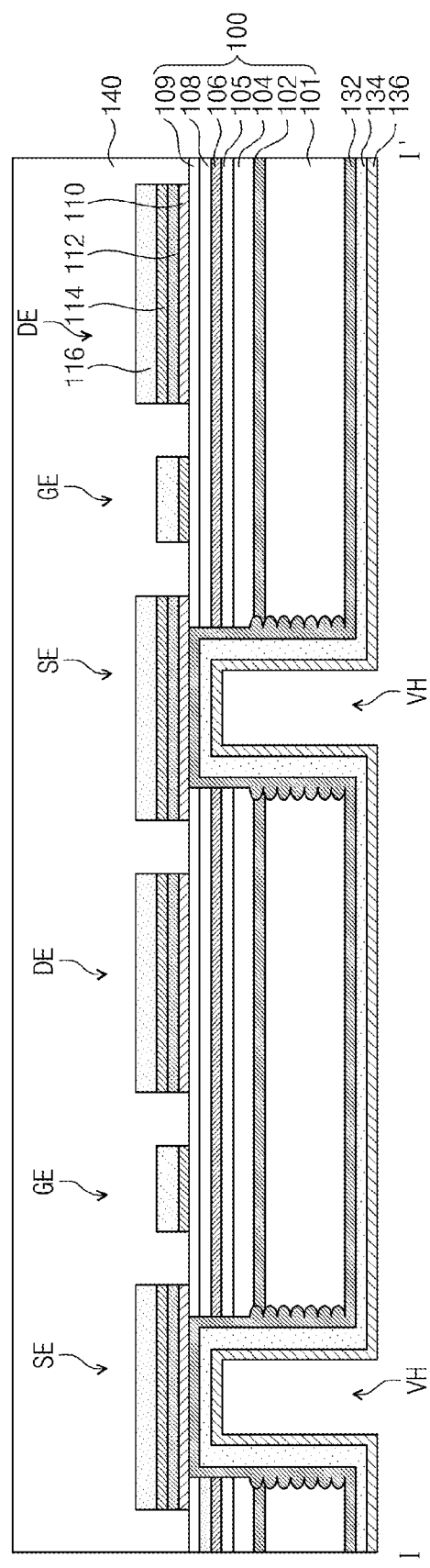

Referring to FIG. 2H, a protecting layer 140 may be formed on the front surface of the substrate 110 on which the semiconductor devices are formed. The protecting layer 140 may include a photoresist.

Figure 2I:
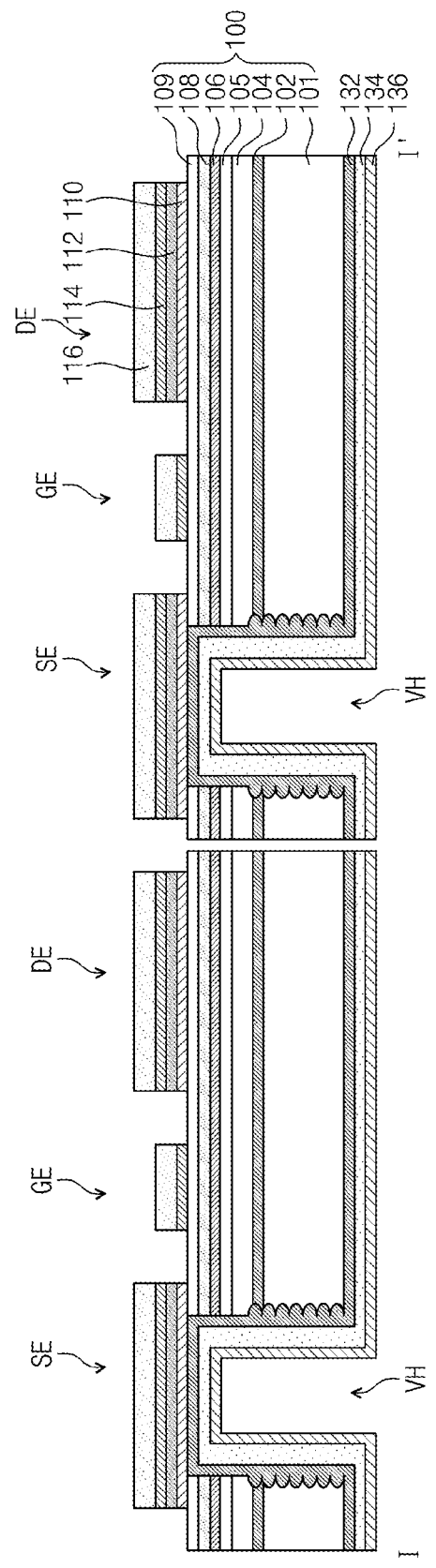

Referring to FIG. 2I, the semiconductor devices may be separated from each other by a cutting process.

Water may be sprayed during the cutting process. The protecting layer 140 of FIG. 2H may prevent the semiconductor devices from being damaged by water pressure during the cutting process. In particular, if the cutting process is performed without the protecting layer 140, the source electrode SE connected to the ground interconnection 134 may be more damaged. Thus, the damage of the source electrode SE may be prevented due to the protecting layer 140. After the cutting process is performed, the protecting layer 140 may be removed.

Figure 3A:
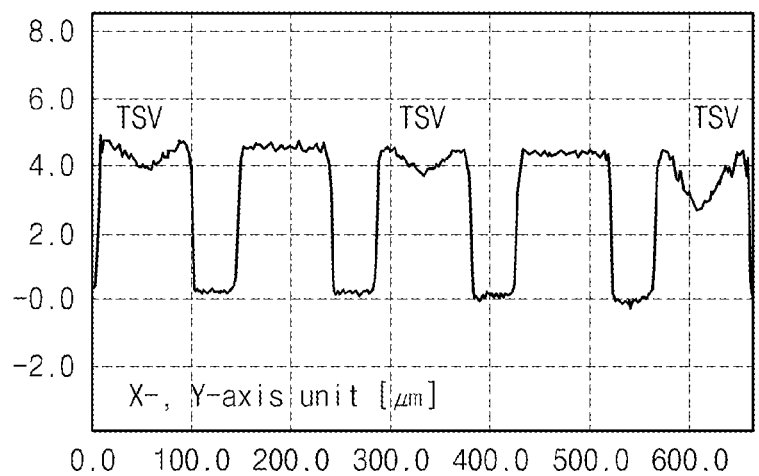
FIG. 3A is a graph illustrating a cross section of a via after a cutting process is performed without a protecting layer.
Figure 3B:
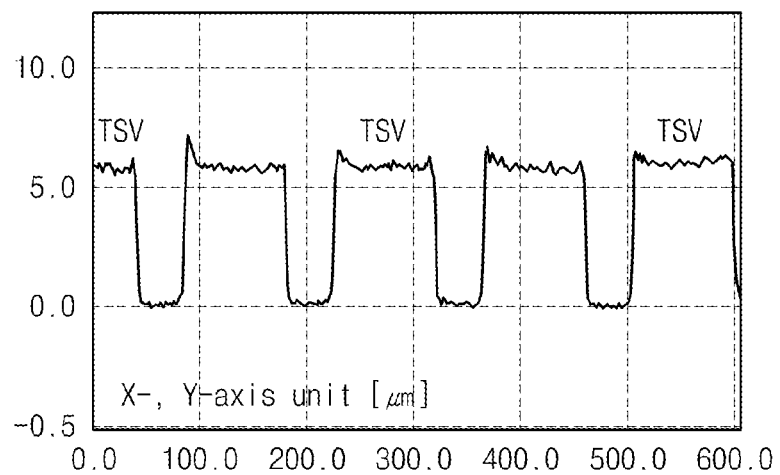
FIG. 3B is a graph illustrating a cross section of a via after a cutting process is performed on devices covered by a protecting layer.

FIG. 3A is a graph illustrating a cross section of a via after a cutting process is performed without a protecting layer, and FIG. 3B is a graph illustrating a cross section of a via after a cutting process is performed on devices covered by a protecting layer.

Referring to FIG. 3A, a height difference of a concave shape occurs at a top end of the via. Referring to FIG. 3B, a top end of the via is substantially flat. Thus, it is confirmed that the stress is applied to the via if the cutting process is performed without the protecting layer 140.

According to embodiments of the inventive concept, the source electrode is connected to the ground interconnection through the back surface via-hole formed in the substrate. Thus, the heat radiating effect of the semiconductor device may be improved. Additionally, the different materials from each other of the substrate may be etched by different powers from each other, respectively. Thus, the etch stress caused during the process may be reduced. As a result, the semiconductor device having excellent electrical and thermal characteristics may be realized.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A method of manufacturing a semiconductor device, the method comprising:

forming devices on a front surface of a substrate, each of the devices including a source electrode, a drain electrode, and a gate electrode, and the substrate including a bulk silicon, a buried oxide layer, an active silicon, a gallium nitride layer, and an aluminum-gallium nitride layer which are sequentially stacked;

forming a via-hole penetrating the substrate by etching a back surface of the substrate, the via-hole exposing a bottom surface of the source electrode;

conformally forming a ground interconnection on the back surface of the substrate having the via-hole;

after forming the via-hole and the ground interconnection, forming a protecting layer on the front surface of the substrate on which the devices are formed; and after forming the protecting layer, cutting the substrate between the devices to separate the devices from each other, wherein the protecting layer is disposed on the front surface of the substrate while the cutting of the substrate.

2. The method of claim 1, wherein forming the via-hole comprises:

forming a mask on the back surface of the substrate;

etching the bulk silicon using the mask as an etch mask by a reactive ion etching (RIE) process until the buried oxide layer is exposed;

etching the exposed buried oxide layer and the active silicon by a radio frequency (RF) plasma process until the gallium nitride layer is exposed; and etching the exposed gallium nitride layer and the aluminum-gallium nitride layer by an induced coupled plasma reactive ion etching (ICP RIE) process.

3. The method of claim 1, before forming the via-hole, further comprising:

forming an insulating layer on the front surface of the substrate on which the devices are formed; and bonding a handle wafer to a top surface of the insulating layer.

4. The method of claim 3, wherein the insulating layer includes poly methyl methacrylate (PMMA); and wherein the handle wafer is bonded to the insulating layer by a wax.

5. The method of claim 1, further comprising:

forming a seed layer on the back surface of the substrate having the via-hole, wherein the ground interconnection is formed using the seed layer.

6. The method of claim 5, wherein the seed layer includes titanium/copper (Ti/Cu); and wherein the ground interconnection is formed by a copper plating process.

7. The method of claim 1, wherein the protecting layer includes a photoresist.

8. The method of claim 1, wherein water is sprayed during the cutting process of the substrate.

9. The method of claim 1, further comprising:

forming a nucleation layer on the active silicon, wherein the gallium nitride layer is formed by an epitaxial growth process using the nucleation layer as a seed.

10. The method of claim 9, wherein the nucleation layer includes aluminum nitride (AlN).

11. The method of claim 1, further comprising:

forming a capping layer on the aluminum-gallium nitride layer.

12. The method of claim 11, wherein the capping layer includes gallium nitride (GaN).

13. The method of claim 1, wherein a handle wafer is formed to cover the front surface of the substrate after forming the devices and before forming the via-hole, and the handle wafer is removed before forming the protecting layer.

14. The method of claim 1, wherein a top surface of the gate electrode is lower than a top surface of each of the source and drain electrodes.

* * * * *